United States Patent [19]

Nagai et al.

[11] Patent Number: 5,733,368
[45] Date of Patent: Mar. 31, 1998

[54] METHOD OF MANUFACTURING SILICON MONOCRYSTAL USING CONTINUOUS CZOCHRALSKI METHOD

[75] Inventors: Naoki Nagai; Isamu Harada; Michiaki Oda, all of Annaka, Japan

[73] Assignee: Shin-Etsu Handotai Co., Ltd., Tokyo, Japan

[21] Appl. No.: 804,123

[22] Filed: Feb. 20, 1997

[51] Int. Cl.$^6$ .................................................. C30B 15/02
[52] U.S. Cl. .............................. 117/18; 117/30; 117/33; 117/217
[58] Field of Search .................. 117/14, 15, 18, 117/19, 30, 33, 208, 214, 217

[56] References Cited

U.S. PATENT DOCUMENTS

| | | | |
|---|---|---|---|
| 4,660,149 | 4/1987 | Lissalde et al. | 117/15 |
| 5,462,011 | 10/1995 | Tomzig et al. | 117/18 |
| 5,485,802 | 1/1996 | Altekruger et al. | 117/14 |
| 5,524,571 | 6/1996 | Kawasaki et al. | 117/18 |
| 5,587,016 | 12/1996 | Altekrüger et al. | 117/217 |
| 5,588,993 | 12/1996 | Holder | 117/18 |

FOREIGN PATENT DOCUMENTS

| | | |
|---|---|---|
| 0142415 | 5/1985 | European Pat. Off. . |
| 0170856 | 2/1986 | European Pat. Off. . |
| 4301072 | 7/1994 | Germany . |
| 1-122988 | 5/1989 | Japan . |

*Primary Examiner*—Felisa Garrett
*Attorney, Agent, or Firm*—Oliff & Berridge, PLC

[57] ABSTRACT

In a method of manufacturing a silicon monocrystal using a continuous Czochralski method, a silicon monocrystal is pulled from a silicon melt in a crucible while a silicon material is fed to the crucible. Supply of the silicon material is suspended until the temperature distribution of the silicon melt becomes stable after initiation of a straight body forming process, and the supply of the silicon material is commenced when the temperature distribution of the silicon melt has become stable. The feed rate of the silicon material is gradually increased until the feed rate becomes equal to a solidification rate of the silicon melt after the supply of the silicon material has been commenced. This method prevents the silicon monocrystal from becoming a polycrystal during the manufacture thereof.

16 Claims, 4 Drawing Sheets

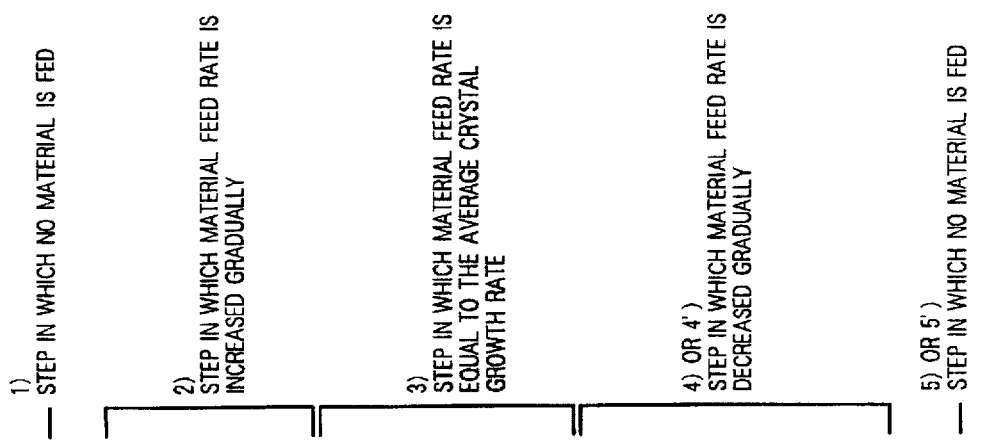
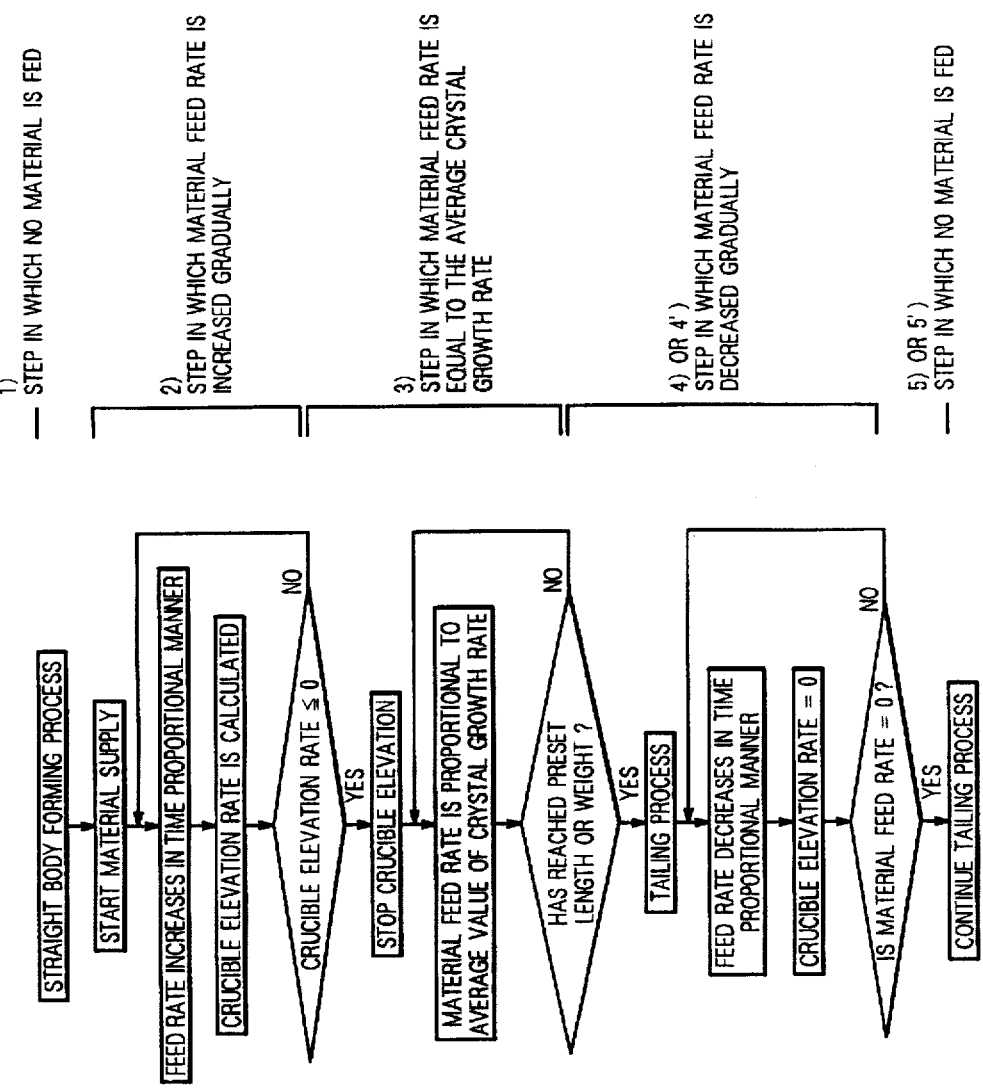
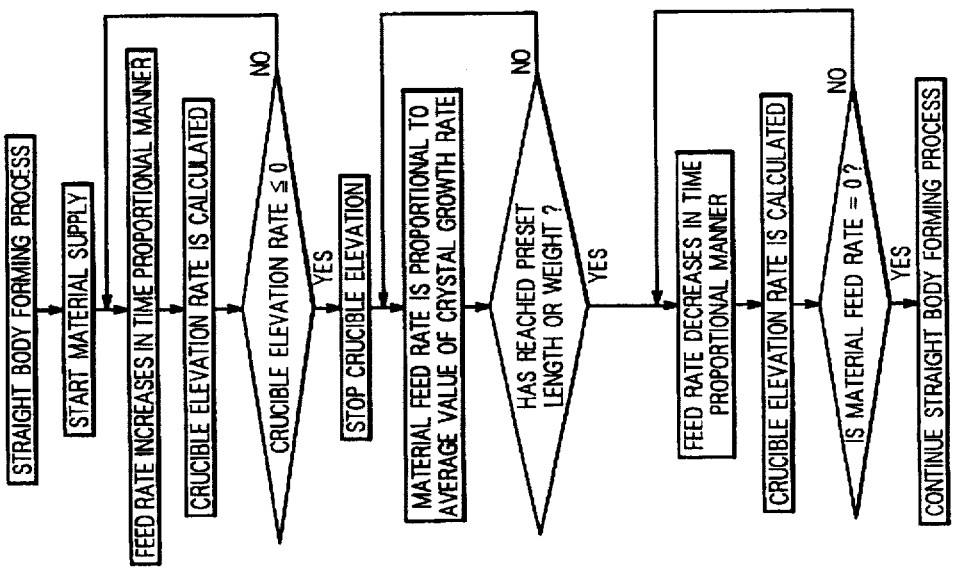

1) STEP IN WHICH NO MATERIAL IS FED AND THE CRUCIBLE IS ELEVATED
2) STEP IN WHICH MATERIAL FEED RATE IS INCREASED GRADUALLY
3) STEP IN WHICH MATERIAL FEED RATE IS EQUAL TO THE AVERAGE CRYSTAL PULLING RATE
4) STEP IN WHICH MATERIAL FEED RATE IS DECREASED GRADUALLY
5) STEP IN WHICH NO MATERIAL IS FED AND THE CRUCIBLE IS ELEVATED

METHOD OF MANUFACTURING SILICON MONOCRYSTAL USING CONTINUOUS CZOCHRALSKI METHOD

BACKGROUND OF THE INVENTION

1. Field of the Invention

The present invention relates to a method of manufacturing a silicon monocrystal using the continuous Czochralski (CCZ) method.

2. Description of the Related Art

In the CCZ method, the silicon monocrystal is manufactured by being pulled from silicon melt in a crucible while silicon material is fed to the silicon melt, the amount of which has decreased as a result of pulling of the silicon monocrystal. According to this method, the silicon monocrystal can be pulled while the amount of the silicon melt in the crucible is maintained. Therefore, the oxygen concentration and resistivity of the silicon monocrystal, which depend on the amount of the silicon melt in the crucible, can be constantly maintained. This makes it possible to considerably improve the manufacturing yield of the silicon monocrystal, which in turn allows reduction in manufacturing costs.

Generally, in the manufacture of a silicon monocrystal using the Czochralski (CZ) Method, a seed crystal is brought into contact with the silicon melt to grow a silicon crystal on the tip of the seed crystal. After the formation of a neck portion where dislocations are eliminated, a cone portion is formed so as to increase the diameter of the silicon crystal to a desired value. After the diameter of the silicon crystal has reached the desired value, a straight body forming process (hereinafter referred also to as the body process) is carried out so as to form a body portion such that a shoulder portion is formed between the cone portion and the body portion. Then, the body portion of the silicon crystal is linearly grown in a columnar shape to a predetermined length. After a tail portion of the silicon crystal has been formed in a tailing process, the manufacture of the silicon monocrystal is completed.

According to the conventional CCZ method, the supply of the silicon material is started simultaneously with the start of the straight body forming process. In order to maintain the level of the melt constant, the silicon material is supplied at the same rate as a solidification rate of the silicon melt which corresponds to a pulling rate (SE; seed elevation) of the silicon monocrystal. However, as a result of initiation of the supply of the silicon material at the same rate as the solidification rate of the silicon melt, the distribution of temperature of the silicon melt within a crucible becomes considerably jumbled, which makes the growing monocrystal apt to become polycrystalline. Further, according to the conventional CCZ method, the supply of the silicon material at the same rate as the solidification rate of the silicon melt is continued, and the supply of the silicon material is stopped immediately before the silicon crystal is subjected to the tailing process. As a result of the suspension of the supply of the silicon material at the same rate as the solidification rate of the silicon melt, the distribution of temperature of the silicon melt within the crucible again becomes considerably jumbled. Similarly, the growing crystal is apt to become polycrystalline. In contrast to the ordinary CZ method, it is impossible to melt the crystal and to pull the silicon monocrystal again in the CCZ method. There is a very strong demand for the CCZ method which prevents the crystal from becoming polycrystalline.

SUMMARY OF THE INVENTION

An object of the present invention is to provides a method of manufacturing a silicon monocrystal using the continuous Czochralski method that can prevent the silicon monocrystal from becoming a polycrystal.

Through several studies conducted to solve the aforementioned problems, the inventors of the present invention have found that improving the way of supply of the silicon material makes it possible to prevent a silicon monocrystal from becoming polycrystalline during the course of manufacture of the silicon monocrystal using the CCZ method. More specifically, at the time of starting the body or tailing process, it is necessary to considerably change the temperature distribution of the silicon melt in order to abruptly change the diameter of or the growth form of the crystal. At these times, the temperature distribution of the silicon melt tends to become jumbled. In addition, at these times, the supply of the silicon material which has a lower temperature than that of the silicon melt is initiated or stopped as described above, and as a result the temperature distribution of the silicon melt becomes considerably jumbled. Consequently, the silicon monocrystal becomes polycrystalline. When the body or tailing process is started, it is inevitable that the temperature distribution of the silicon melt be considerably changed in order to abruptly change the diameter of or the growth form of the crystal. It was found that the silicon monocrystal could be prevented from becoming polycrystalline by avoiding the initiation and suspension of the supply of the silicon material at the same rate as the solidification rate of the silicon melt at these times, and by gradually increasing or decreasing a feed rate of the silicon material.

The present invention provides a method of manufacturing a silicon monocrystal using a continuous Czochralski method wherein a silicon monocrystal is pulled from a silicon melt in a crucible while a silicon material is fed to the crucible, the method being characterized by comprising the steps of:

1) suspending supply of the silicon material until the temperature distribution of the silicon melt becomes stable after initiation of a straight body forming process, and commencing the supply of the silicon material when the temperature distribution of the silicon melt has become stable; and 2) gradually increasing a feed rate of the silicon material until the feed rate becomes equal to a solidification rate of the silicon melt after the supply of the silicon material has been commenced.

Particularly, the present invention provides a method of manufacturing a silicon monocrystal using a continuous Czochralski method wherein a silicon monocrystal is pulled from a silicon melt in a crucible while a silicon material is fed to the crucible, the method being characterized by comprising the steps of:

1) suspending supply of the silicon material until the temperature distribution of the silicon melt becomes stable after initiation of a straight body forming process, and commencing the supply of the silicon material when the temperature distribution of the silicon melt has become stable;

2) gradually increasing a feed rate of the silicon material until the feed rate becomes equal to a solidification rate of the silicon melt after the supply of the silicon material has been commenced;

3) continuing the supply of the silicon material at the feed rate equal to the solidification rate of the silicon melt for a given period of time after the feed rate of the silicon material has become equal to the solidification rate of the silicon melt;

4) gradually decreasing the feed rate of the silicon material to zero; and 5) continuing the straight body forming process while the feed rate of the silicon material is maintained at zero, and commencing a tailing process after the temperature distribution of the silicon melt has become stable.

Further, the present invention provides a method of manufacturing a silicon monocrystal using a continuous Czochralski method wherein a silicon monocrystal is pulled from a silicon melt in a crucible while a silicon material is fed to the crucible, the method being characterized by comprising the steps of:

1) suspending supply of the silicon material until the temperature distribution of the silicon melt becomes stable after initiation of a straight body forming process, and commencing the supply of the silicon material when the temperature distribution of the silicon melt has become stable;

2) gradually increasing a feed rate of the silicon material until the feed rate becomes equal to a solidification rate of the silicon melt after the supply of the silicon material has been commenced;

3) continuing the supply of the silicon material at the feed rate equal to the solidification rate of the silicon melt for a given period of time after the feed rate of the silicon material has become equal to the solidification rate of the silicon melt;

4') commencing a tailing process, and gradually decreasing the feed rate of the silicon material to zero from the initiation of the tailing operation; and, if necessary, 5') continuing the tailing process while maintaining the feed rate of the silicon material at zero.

In the present invention, it is preferred that the feed rate of the silicon material be increased or decreased at a constant rate in step 2), 4), or 4'), because this makes the temperature distribution of the silicon melt apt to become stabler.

In the present invention, the feed rate of the silicon material in step 3) is preferably matched with the mean value of the solidification rate of the silicon melt as measured over a period of more than 30 min, because the feed rate of the silicon material is prevented from becoming uncontrollable.

In the present invention, steps 1), 2), 4), and 5) are carried out while the crucible is elevated so as to maintain the level of the surface of the silicon melt constant. At this time, the feed rate of the silicon material and an elevation rate (CE) of the crucible should preferably be automatically controlled. For instance, in step 2), the feed rate of the silicon material is calculated on the assumption that a rate of increase in the feed rate of the silicon material is constant. The feed rate of the silicon material is controlled in accordance with the result of the calculation. On the other hand, a pulling rate of the silicon monocrystal is detected, and the elevation rate of the crucible is calculated from the thus-detected pulling rate of the silicon monocrystal and the thus-calculated feed rate of the silicon material such that the level of the surface of the silicon melt becomes constant. The elevation rate of the crucible is controlled in accordance with the result of such calculation. In step 4), the feed rate of the silicon material is calculated on the assumption that a rate of decrease in the feed rate of the silicon material is constant. The feed rate of the silicon material is controlled in accordance with the result of the calculation. On the other hand, the pulling rate of the silicon monocrystal is detected. The elevation rate of the crucible is calculated from the thus-detected pulling rate of the silicon monocrystal and the thus-calculated feed rate of the silicon material such that the level of the surface of the silicon melt becomes constant. The elevation rate of the crucible is controlled in accordance with the result of such calculation. In step 4'), the feed rate of the silicon material is calculated on the assumption that a rate of decrease in the feed rate of the silicon material is constant, and the feed rate is controlled in accordance with the result of the calculation.

BRIEF DESCRIPTION OF THE DRAWINGS

FIG. 2A is a flowchart showing a first embodiment of the CCZ-based silicon monocrystal manufacturing method of the present invention which comprises steps 1) to 5);

FIG. 2B is a flowchart showing a second embodiment of the CCZ-based silicon monocrystal manufacturing method of the present invention which comprises steps 1) to 5');

DESCRIPTION OF THE PREFERRED EMBODIMENTS

With reference to the accompanying drawings, embodiments of the present invention will be described.

Figure 1:
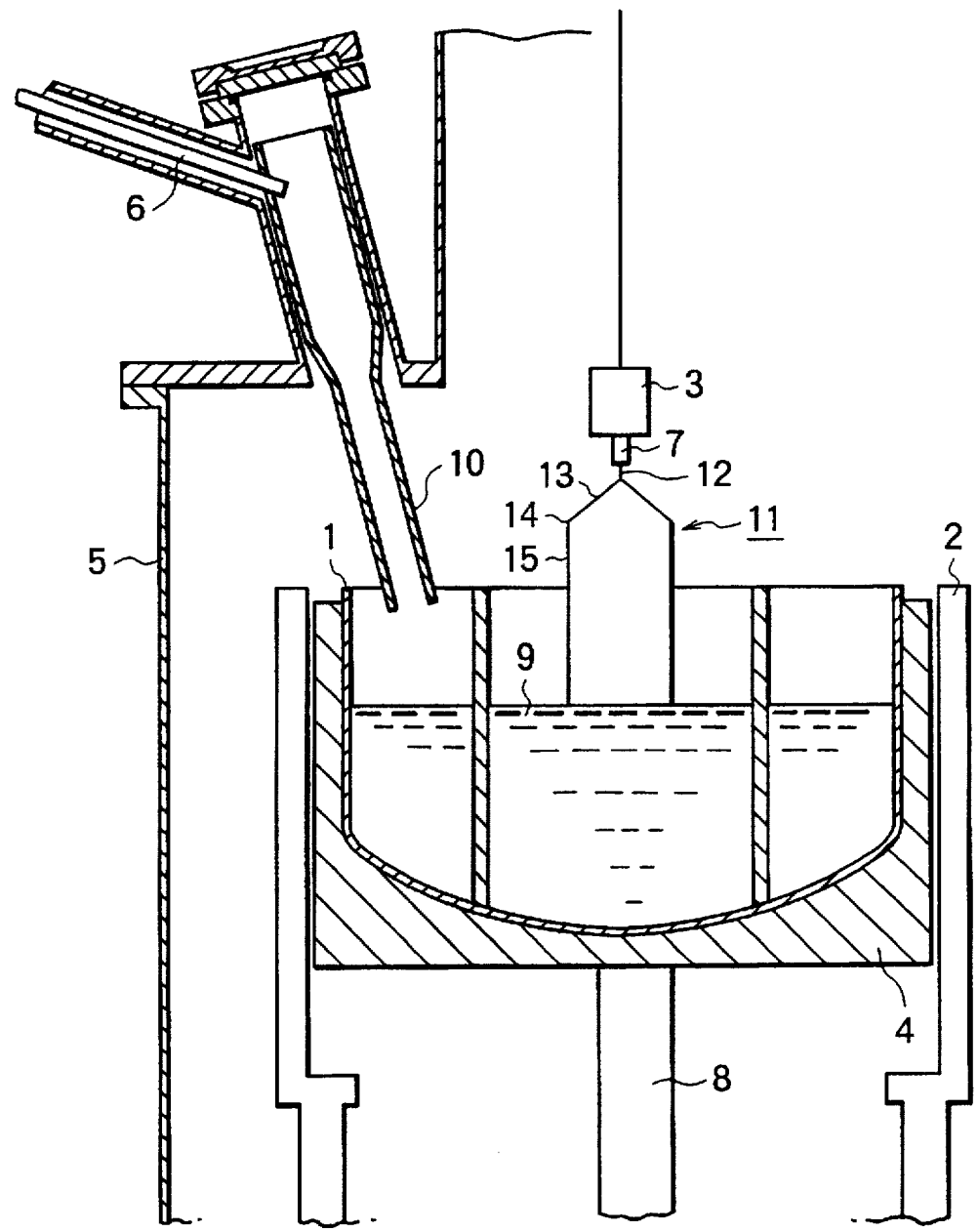
FIG. 1 is a schematic cross-sectional view showing an example of an apparatus for use with a CCZ-based silicon monocrystal manufacturing method according to the present invention.

FIG. 1 is a schematic cross-sectional view showing an example of an apparatus for use with a CCZ-based silicon monocrystal manufacturing method according to the present invention.

In FIG. 1, reference numeral 1 designates a double crucible which is made of quartz and is housed in a chamber 5. The double crucible 1 is supported by a graphite crucible 4. A rotary shaft 8 is attached to the graphite crucible 4, and the double crucible 1 and the graphite crucible 4 are rotatable and movable up and down. The graphite crucible 4 is surrounded by a graphite heater 2. A pulling member 3 such as a pulling wire or shaft for holding a seed crystal 7, which is rotatable and movable up and down, is lowered from the upper center of the chamber 5. The apparatus is further provided with a supply tube 10 for feeding granular silicon material to the double crucible 1. The granular silicon material is fed to the supply tube 10 from a feeder 6. The feeder 6 is capable of continuously or intermittently feeding a fixed or variable amount of granular silicon material to the supply tube 10.

FIGS. 2A and 2B are flowcharts showing first and second embodiments of the CCZ-based silicon monocrystal manufacturing method of the present invention. FIG. 2A is a flowchart showing the first embodiment of the CCZ-based silicon monocrystal manufacturing method of the present invention which comprises steps 1) to 5). Further, FIG. 2B is a flowchart showing the second embodiment of the CCZ-based silicon monocrystal manufacturing method of the present invention which comprises steps 1) to 5'). FIGS. 2A and 2B show processes following initiation of a straight body forming process, but not processes prior to the initiation of the straight body forming process. Therefore, the processes prior to the initiation of the straight body forming process will be briefly described with reference to FIG. 1.

According to the present CCZ-based silicon monocrystal manufacturing method, the double crucible 1 is filled with a silicon material. The silicon material is heated by a heater 2, so that silicon melt 9 is produced. The pulling member 3 that holds the seed crystal 7 at the tip thereof is lowered, so that the seed crystal 7 is brought into contact with the silicon melt 9. Subsequently, a silicon monocrystal 11 is grown on the tip of the seed crystal 7 while the pulling member 3 is rotated and elevated. The silicon monocrystal 11 grows as follows. After the formation of a neck portion 12 where dislocations are eliminated, a cone portion 13 is formed so as to increase the diameter of the silicon crystal up to a desired diameter. After the diameter of the silicon crystal has reached the desired diameter, a straight body forming process is conducted so as to form a body portion 15 such that a shoulder portion 14 is formed between the cone portion 13 and the body portion.

As shown in FIGS. 2A and 2B, a silicon material is not supplied for a while after the straight body forming process has been started. After the temperature distribution of the silicon melt has become stable, supply of granular silicon material from the supply tube is commenced [step 1)]. Whether or not the temperature distribution of the silicon melt has become stable is empirically determined on the basis of variations in the diameter of the silicon monocrystal to be pulled and variations in the pulling speed of the crystal. For example, in pulling a silicon monocrystal having a diameter of 6 inches, the temperature distribution of the silicon melt usually becomes stable when the length of the silicon body has become 5 cm or thereabouts. The feed rate of the silicon material should not be set to the solidification rate of the silicon melt immediately after the supply of the silicon material has been commenced. The feed rate of the silicon material is gradually increased until it becomes equal to the solidification rate of the silicon melt so as to avoid making the temperature distribution of the silicon melt jumbled [step 2)]. It is desirable to increase the feed rate of the silicon material in a time proportioning manner; i.e., at a constant rate, because this makes the temperature distribution of the silicon melt less apt to become jumbled.

It is necessary to maintain a constant level of the surface of the melt in steps 1) and 2) in order to correctly control the diameter of the monocrystal rod to be pulled. For this reason, the crucible is raised in steps 1) and 2) such that the level of the surface of the melt is constantly maintained. The feed rate of the silicon material is gradually increased in step 2) so as to become equal to the solidification rate of the silicon melt. The elevation rate of the crucible is calculated from the thus-gradually-increasing feed rate of the silicon material and the solidification rate of the silicon melt. As the feed rate of the silicon material becomes greater, the elevation rate of the crucible becomes gradually decreased. When the thus-calculated elevation rate of the crucible becomes less than zero, the raising of the crucible is stopped. Then, the processing proceeds to step 3).

In step 3), the supply of the silicon material at the feed rate that is equivalent to the solidification rate of the silicon melt is continued for a predetermined period of time; namely, until the body is grown to a predetermined length or a predetermined weight [step 3)]. In step 3), the elevation speed of the crucible remains at zero. The solidification rate of the silicon melt is not stable but varies. Hence, the mean value of the solidification rate of the silicon melt for a given period of time is obtained, and the feed rate of the silicon material must be matched up with the thus-obtained mean value of the solidification rate of the silicon melt. In this event, if the time during which the mean value is obtained is too short; for instance, if the mean value of the solidification rate of the silicon melt is obtained for the period of time during which the solidification rate is large, the feed rate of the silicon material will become larger as a result of matching the feed rate of the silicon material with the thus-obtained mean value. Even if an attempt is made to keep the temperature of the silicon melt constant by increasing the heater power, it takes an appreciable amount of time to return the temperature of the silicon melt to the original level once the temperature has dropped as a result of supply of a large quantity of the silicon material. Therefore, at this time, it is too late to prevent the temperature of the silicon melt from decreasing. As a result of such a drop in temperature, the solidification rate of the silicon melt becomes larger. If the mean value of the solidification rate of the silicon melt is obtained once again, the mean value will become large because the solidification rate itself has become large to a much greater extent. In response to such an increase in the means value, the feed rate of the silicon material also becomes larger. In the end, it becomes impossible to control the feed rate of the silicon material through repetition of such an increase. To prevent this problem, it is desirable to measure the mean value of the solidification rate of the silicon melt over a period of more than 30 min.

Subsequent to step 3), the feed rate of the silicon material is gradually decreased so as to avoid making the temperature distribution of the silicon melt jumbled while the straight body forming process is continued [step 4)], as shown in FIG. 2A. The feed rate of the silicon material is preferably decreased in a time proportioning manner; i.e., at a constant rate, because this makes the temperature distribution of the silicon melt less apt to become jumbled.

Subsequently, the straight body forming process is continued while the feed rate of the silicon material is maintained at zero, and a tailing process is commenced when the temperature distribution of the silicon melt has become stable [step 5)].

It is necessary to maintain a constant level of the surface of the melt in steps 4) and 5) in order to correctly control the diameter of the monocrystal rod that is being pulled. For this reason, as in steps 1) and 2), the crucible is also raised in steps 4) and 5) such that the level of the surface of the melt is maintained constantly. In step 4), the feed rate of the silicon material is gradually decreased to zero from the rate which is equivalent to the solidification rate of the silicon melt. The elevation rate of the crucible is calculated from the thus-gradually-decreasing feed rate of the silicon material and the solidification rate of the silicon melt. As the feed rate of the silicon material becomes smaller, the elevation rate of the crucible becomes gradually increased.

Alternatively, as shown in FIG. 2B, a tailing process is commenced after step 3). In this event, the supply of the silicon material is not completely suspended immediately before the silicon rod is subjected to the tailing process. The temperature distribution of the silicon melt is prevented from becoming jumbled by gradually decreasing the feed rate of the silicon material to zero from when the tailing process is commenced [step 4')]. Even in this case, the feed rate of the silicon material is preferably decreased in a time proportioning manner; i.e., at a constant rate, because this makes the temperature distribution of the silicon melt less apt to become jumbled. Subsequent to step 4'), the tailing process is continued [step 5')] while the feed rate of the silicon material is maintained at zero; namely, while the supply of the silicon material is suspended, as required, whereby the pulling of the silicon monocrystal rod is completed. It is not necessary to raise the crucible in steps 4') and 5'). The reason for this is that in contrast to the straight body forming process it is not necessary to control the diameter of the crystal by maintaining a constant level of the surface of the melt.

Figure 3A:
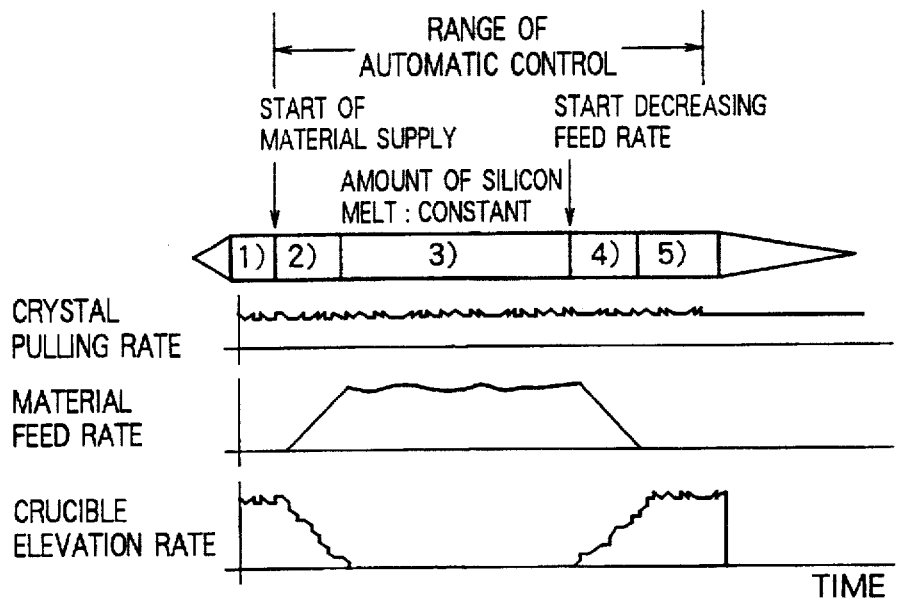
FIG. 3A is a diagrammatic representation showing a third embodiment of a silicon monocrystal manufacturing method of the present invention which comprises steps 1) to 5)
Figure 3B:
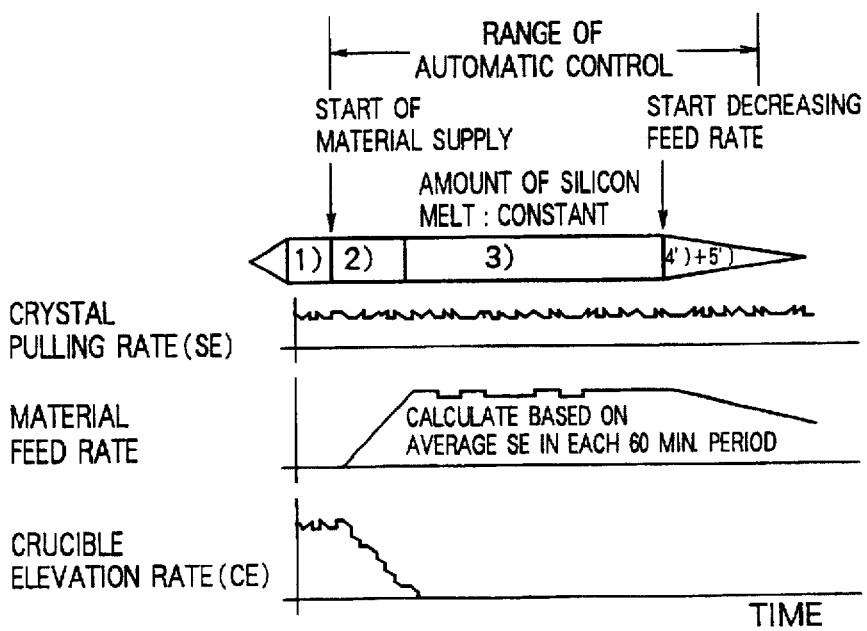
FIG. 3B is a diagrammatic representation showing a fourth embodiment of a silicon monocrystal manufacturing method of the present invention which comprises steps 1) to 5')

Third and fourth embodiments of a silicon monocrystal manufacturing method of the present invention are diagrammatically represented in FIGS. 3A and 3B. FIG. 3A is a diagrammatic representation showing the third embodiment of a silicon monocrystal manufacturing method of the present invention which comprises steps 1) to 5). FIG. 3B is a diagrammatic representation showing the fourth embodiment of a silicon monocrystal manufacturing method of the present invention which comprises steps 1) to 5').

As has been described above, the method of manufacturing a silicon monocrystal of the present invention preferably comprises steps 1) to 5) or 1) to 5'). In these steps, the feed rate of the silicon material and the elevation rate of the crucible are preferably automatically controlled in steps 2) to 5) or 2) to 5'), as shown in FIG. 3A or FIG. 3B. In this case, the feed rate of the silicon material is calculated on the assumption that a rate of increase in the feed rate of the silicon material is constant. The feeder is controlled in accordance with the result of the calculation, whereby the feed rate of the silicon material is controlled. On the other hand, the pulling rate (a growth rate) of the silicon monocrystal is detected. The elevation rate of the crucible is calculated in real time from the thus-detected pulling rate of the silicon monocrystal and the thus-calculated feed rate of the silicon material such that the level of the surface of the silicon melt becomes constant. The rotary shaft is controlled in accordance with the calculation result of the elevation rate of the crucible, whereby the elevation rate of the crucible is controlled.

If the thus-calculated elevation rate of the crucible becomes zero or less, the elevation of the crucible is stopped, and the processing then proceeds to step 3). In step 3), the pulling rate of the silicon monocrystal is detected, and the mean value of the pulling rate of the silicon monocrystal is calculated from the pulling rate of the silicon monocrystal detected for more than 30 min.; e.g., for 60 min. The feed rate of the silicon material is calculated from the mean value of the pulling rate of the silicon monocrystal such that the level of the surface of the silicon melt becomes constant. Subsequently, the mean value of the pulling rate of the silicon monocrystal is recalculated e.g., every 60 min., whereby the feed rate of the silicon material is recalculated. The feeder is controlled in accordance with the calculation result of the feed rate of the silicon material to thus control the feed rate of the silicon material.

If the body of the silicon has grown to a predetermined length or weight, the processing proceeds to step 4) or 4'). In step 4), the straight body forming process carried out in step 3) is continuously performed. In step 4), the feed rate of the silicon material is calculated on the assumption that a rate of decrease in the feed rate of the silicon material is constant. In accordance with the result of the calculation, the feeder is controlled, whereby the feed rate of the silicon material is controlled. On the other hand, the pulling rate (or the growth rate) of the silicon monocrystal is detected. The elevation rate of the crucible is calculated in real time from the thus-detected pulling rate of the silicon monocrystal and the thus-calculated feed rate of the silicon material such that the level of the surface of the silicon melt becomes constant. The rotary shaft is controlled in accordance with the calculation result of the elevation rate of the crucible, whereby the elevation rate of the crucible is controlled. If the thus-calculated feed rate of the silicon material becomes zero, the supply of the silicon material is suspended, and the processing then proceeds to step 5). Even in step 5), the straight body forming process is continuously carried out. In step 5), the pulling rate of the silicon monocrystal is detected, and the elevation rate of the crucible is calculated from the result of the detection such that the level of the surface of the silicon melt becomes constant. The rotary shaft is controlled in accordance with the calculation result, whereby the elevation rate of the crucible is controlled. If the body has grown to a predetermined length, the silicon rod is shifted to the tailing process from the straight body forming process. In the tailing process, the elevation rate of the crucible is maintained at zero. Subsequently, the pulling of the silicon monocrystal is completed.

When the processing proceeds to step 4'), the silicon monocrystal is subjected to the tailing process. In step 4'), the elevation rate of the crucible is maintained at zero as it is in step 3). The feed rate of the silicon material is calculated on the assumption that a rate of decrease in the feed rate of the silicon material is constant. The feeder is controlled in accordance with the calculation result, whereby the feed rate of the silicon material is controlled. When the thus-calculated feed rate becomes zero, the tailing operation is continued [step 5')] if the tailing processing has not yet been completed. Thus, the pulling of the silicon monocrystal is now completed.

Figure 4:
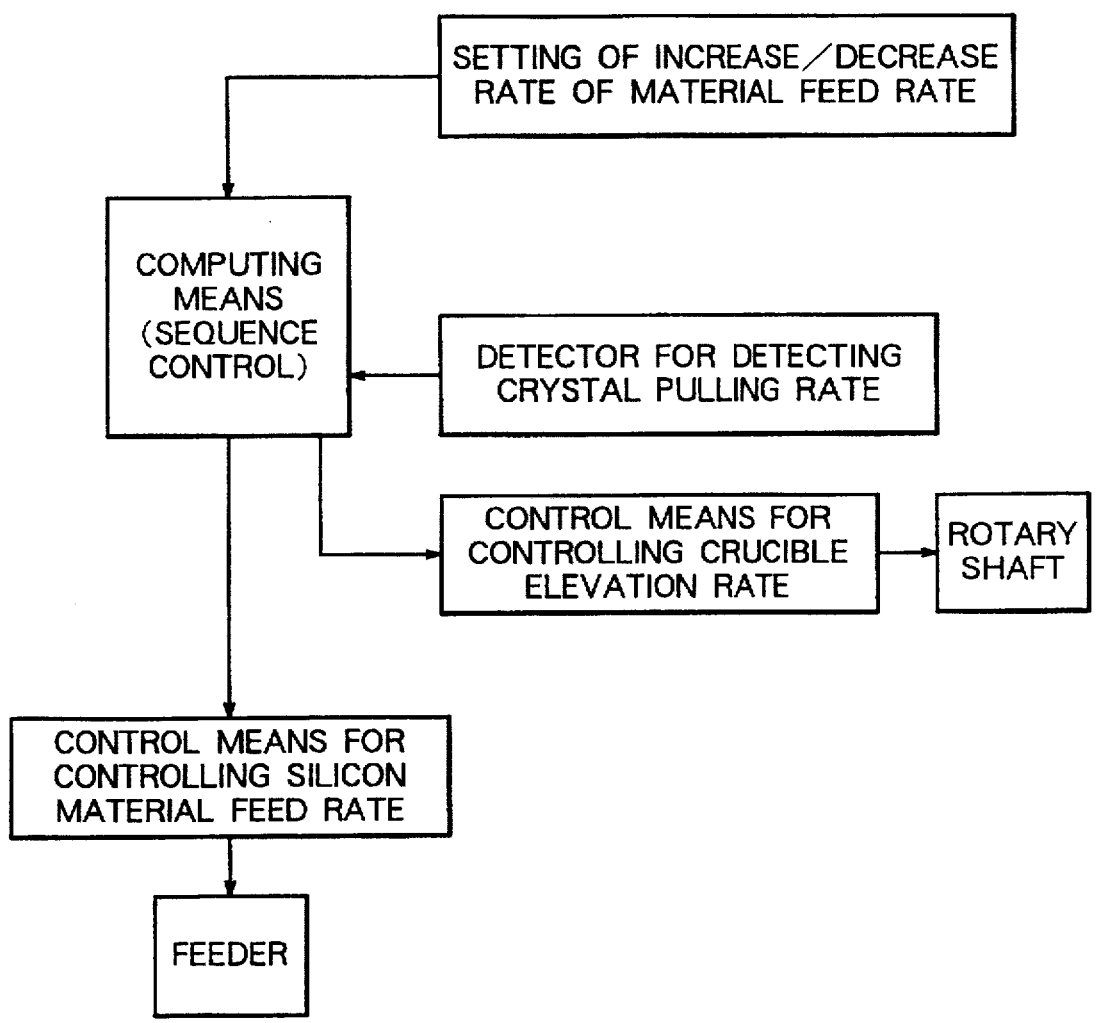
FIG. 4 is a block diagram which shows the relationship between a detector for detecting a pulling rate of a silicon monocrystal, control means for controlling a feed rate of the silicon material, control means for controlling an elevation rate of a crucible, and computing means used in the present invention.

FIG. 4 is a block diagram which shows the relationship between a detector for detecting the pulling rate of the silicon monocrystal, control means for controlling the feed rate of the silicon material, control means for controlling the elevation rate of the crucible, and computing means.

EMBODIMENT

An embodiment of the present invention will be described hereinbelow.

A double crucible comprises an outer crucible having a diameter of 18 inches and an inner crucible having a diameter of 14 inches. Using this double crucible, a silicon monocrystal having a diameter of 6 inches was manufactured by the CCZ method.

1. Before initiation of the straight body forming process:

The double crucible was filled with silicon material, and the silicon material was heated with a heater. As a result, silicon melt was produced. A pulling shaft having a seed crystal retained at the tip end thereof was lowered, so that the seed crystal was brought into contact with the silicon melt. Subsequently, a silicon monocrystal at the tip end of the seed crystal started to grow while the pulling shaft was rotated and raised. After the formation of a neck portion where dislocations were eliminated, a cone portion was formed so as to increase the diameter of the silicon crystal to a desired value. After the diameter of the silicon crystal had reached the desired value, a straight body forming process was carried out so as to form a body portion with a shoulder portion being formed between the cone portion and the body portion.

2. Steps 1) and 2):

As by the ordinary CZ method, for a while after the straight body forming process has started, the silicon monocrystal was pulled while the crucible was raised without supplying silicon material. When the diameter of the body had reached 5 cm, supply of granular silicon material was commenced. The feed rate of the silicon material was increased at a constant rate (0.36 g/min.). On the other hand, the pulling rate of the silicon monocrystal was detected. The elevation rate of the crucible was calculated from the thus-detected pulling rate of the silicon monocrystal and the feed rate of the silicon material such that the level of the surface of the silicon melt became constant. The crucible was raised in accordance with the calculation result.

3. Step 3):

The feed rate of the silicon material became equal to the solidification rate of the silicon melt. When the thus-calculated elevation rate of the crucible became zero or less, the elevation of the crucible was stopped. Subsequently, the silicon material was continuously supplied for a predetermined period of time, at the feed rate equal to the solidification rate of the silicon melt. In this case, the mean value of the solidification rate of the silicon melt was calculated every 60 min. The feed rate of the silicon material was matched with the result of the calculation.

4. Step 4):

When the body of the silicon monocrystal had grown to a predetermined length, the feed rate of the silicon material was reduced by a rate of 0.36 g/min. On the other hand, the pulling rate of the silicon monocrystal was detected. The elevation rate of the crucible was calculated from the thus-detected pulling rate of the silicon monocrystal and the feed rate of the silicon material such that the level of the surface of the silicon melt became constant. The crucible was raised in accordance with the calculation result.

5. Step 5):

When the feed rate of the silicon material had become zero, as by the ordinary CZ method, the silicon monocrystal was pulled without supplying the silicon material while the crucible was raised such that the level of the surface of the melt was maintained constantly. Thus, the straight body forming process was completed.

6. Subsequent to the straight body forming process:

The silicon monocrystal was subjected to the tailing process after having been subjected to the straight body forming process. After the tailing process, the pulling of the silicon monocrystal was completed.

As a result, a silicon monocrystal having a body 110 cm long was obtained without becoming polycrystalline.

By virtue of the present invention, it is possible to prevent the silicon monocrystal from becoming polycrystalline when the supply of the silicon material is commenced and suspended according to the CZ method. As a result, the manufacturing yield of the silicon monocrystal can be increased to a much greater extent, and manufacturing costs of the silicon monocrystal can be reduced further.

What is claimed is:

1. A method of manufacturing a silicon monocrystal using a continuous Czochralski method wherein a silicon monocrystal is pulled from a silicon melt in a crucible while a silicon material is fed to the crucible, said method comprising the steps of:

1) suspending supply of the silicon material until the temperature distribution of the silicon melt becomes stable after initiation of a straight body forming process, and commencing the supply of the silicon material when the temperature distribution of the silicon melt has become stable; and 2) gradually increasing a feed rate of the silicon material until the feed rate becomes equal to a solidification rate of the silicon melt after the supply of the silicon material has been commenced.

2. A method of manufacturing a silicon monocrystal according to claim 1, wherein the feed rate of the silicon material is increased or decreased at a constant rate in step 2).

3. A method of manufacturing a silicon monocrystal according to claim 1, wherein step 1) is carried out while the crucible is elevated so as to maintain the level of the surface of the silicon melt constant.

4. A method of manufacturing a silicon monocrystal according to claim 3, wherein in step 2), the feed rate of the silicon material is calculated on the assumption that a rate of increase in the feed rate of the silicon material is constant, the feed rate of the silicon material is controlled in accordance with the result of the calculation, the pulling rate of the silicon monocrystal is detected, the elevation rate of the crucible is calculated from the thus-detected pulling rate of the silicon monocrystal and the thus-calculated feed rate of the silicon material such that the level of the surface of the silicon melt becomes constant, and the elevation rate of the crucible is controlled in accordance with the result of such calculation.

5. A method of manufacturing a silicon monocrystal using a continuous Czochralski method wherein a silicon monocrystal is pulled from a silicon melt in a crucible while a silicon material is fed to the crucible, said method comprising the steps of:

1) suspending supply of the silicon material until the temperature distribution of the silicon melt becomes stable after initiation of a straight body forming process, and commencing the supply of the silicon material when the temperature distribution of the silicon melt has become stable;

2) gradually increasing a feed rate of the silicon material until the feed rate becomes equal to a solidification rate of the silicon melt after the supply of the silicon material has been commenced;

3) continuing the supply of the silicon material at the feed rate equal to the solidification rate of the silicon melt for a given period of time after the feed rate of the silicon material has become equal to the solidification rate of the silicon melt;

4) gradually decreasing the feed rate of the silicon material to zero; and 5) continuing the straight body forming process while maintaining the feed rate of the silicon material at zero, and commencing a tailing process after the temperature distribution of the silicon melt has become stable.

6. A method of manufacturing a silicon monocrystal according to claim 5, wherein the feed rate of the silicon material is increased or decreased at a constant rate in step 2).

7. A method of manufacturing a silicon monocrystal according to claim 5, wherein the feed rate of the silicon material is matched, in step 3), with the mean value of the solidification rate of the silicon melt as measured over a period equal to or longer than 30 minutes.

8. A method of manufacturing a silicon monocrystal according to claim 5, wherein step 1) is carried out while the crucible is elevated so as to maintain the level of the surface of the silicon melt constant.

9. A method of manufacturing a silicon monocrystal according to claim 8, wherein in step 2), the feed rate of the silicon material is calculated on the assumption that a rate of increase in the feed rate of the silicon material is constant, the feed rate of the silicon material is controlled in accordance with the result of the calculation, the pulling rate of the silicon monocrystal is detected, the elevation rate of the crucible is calculated from the thus-detected pulling rate of the silicon monocrystal and the thus-calculated feed rate of the silicon material such that the level of the surface of the silicon melt becomes constant, and the elevation rate of the crucible is controlled in accordance with the result of such calculation.

10. A method of manufacturing a silicon monocrystal according to claim 8, wherein in step 4), the feed rate of the silicon material is calculated on the assumption that a rate of decrease in the feed rate of the silicon material is constant, the feed rate of the silicon material is controlled in accordance with the result of the calculation, the pulling rate of the silicon monocrystal is detected, the elevation rate of the crucible is calculated from the thus-detected pulling rate of the silicon monocrystal and the thus-calculated feed rate of the silicon material such that the level of the surface of the silicon melt becomes constant, and the elevation rate of the crucible is controlled in accordance with the result of such calculation.

11. A method of manufacturing a silicon monocrystal using a continuous Czochralski method wherein a silicon monocrystal is pulled from a silicon melt in a crucible while a silicon material is fed to the crucible, said method comprising the steps of:

1) suspending supply of the silicon material until the temperature distribution of the silicon melt becomes stable after initiation of a straight body forming process, and commencing the supply of the silicon material when the temperature distribution of the silicon melt has become stable;

2) gradually increasing a feed rate of the silicon material until the feed rate becomes equal to a solidification rate of the silicon melt after the supply of the silicon material has been commenced;

3) continuing the supply of the silicon material at the feed rate equal to the solidification rate of the silicon melt for a given period of time after the feed rate of the silicon material has become equal to the solidification rate of the silicon melt;

4') commencing a tailing process, and gradually decreasing the feed rate of the silicon material to zero from the initiation of the tailing operation; and, if necessary, 5') continuing the tailing process while maintaining the feed rate of the silicon material at zero.

12. A method of manufacturing a silicon monocrystal according to claim 11, wherein the feed rate of the silicon material is increased or decreased at a constant rate in step 2).

13. A method of manufacturing a silicon monocrystal according to claim 11, wherein the feed rate of the silicon material is matched, in step 3), with the mean value of the solidification rate of the silicon melt as measured over a period equal to or longer than 30 minutes.

14. A method of manufacturing a silicon monocrystal according to claim 11, wherein step 1) is carried out while the crucible is elevated so as to maintain the level of the surface of the silicon melt constant.

15. A method of manufacturing a silicon monocrystal according to claim 14, wherein in step 2), the feed rate of the silicon material is calculated on the assumption that a rate of increase in the feed rate of the silicon material is constant, the feed rate of the silicon material is controlled in accordance with the result of the calculation, the pulling rate of the silicon monocrystal is detected, the elevation rate of the crucible is calculated from the thus-detected pulling rate of the silicon monocrystal and the thus-calculated feed rate of the silicon material such that the level of the surface of the silicon melt becomes constant, and the elevation rate of the crucible is controlled in accordance with the result of such calculation.

16. A method of manufacturing a silicon monocrystal according to claim 14, wherein in step 4'), the feed rate of the silicon material is calculated on the assumption that a rate of decrease in the feed rate of the silicon material is constant, and the feed rate is controlled in accordance with the result of the calculation.

* * * * *